(12) United States Patent
Parthasarathy

(10) Patent No.: US 7,730,367 B2
(45) Date of Patent: Jun. 1, 2010

(54) METHOD AND SYSTEM FOR TESTING DEVICES USING LOOP-BACK PSEUDO RANDOM DATA

(75) Inventor: Vasudevan Parthasarathy, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 398 days.

(21) Appl. No.: 11/977,694

(22) Filed: Oct. 25, 2007

(65) Prior Publication Data

US 2009/0113258 A1 Apr. 30, 2009

(51) Int. Cl.
*G01R 31/28* (2006.01)

(52) U.S. Cl. ........................ 714/716; 714/724

(58) Field of Classification Search ............... 714/724, 714/716, 704, 738
See application file for complete search history.

(56) References Cited

U.S. PATENT DOCUMENTS

| | | | | |
|---|---|---|---|---|
| 6,076,175 A * | 6/2000 | Drost et al. | ............. | 714/704 |
| 6,094,737 A * | 7/2000 | Fukasawa | ............. | 714/738 |
| 6,611,795 B2 * | 8/2003 | Cooper | ............. | 702/191 |
| 6,684,351 B1 * | 1/2004 | Bendak et al. | ............. | 714/715 |
| 6,865,700 B1 * | 3/2005 | Malhotra et al. | ............. | 714/704 |
| 7,020,209 B1 * | 3/2006 | Okumura | ............. | 375/253 |
| 7,346,819 B2 * | 3/2008 | Bansal et al. | ............. | 714/726 |
| 7,486,725 B2 * | 2/2009 | Chen et al. | ............. | 375/224 |
| 7,512,860 B2 * | 3/2009 | Miyazaki et al. | ............. | 714/751 |

* cited by examiner

*Primary Examiner*—James C Kerveros
(74) *Attorney, Agent, or Firm*—Farjami & Farjami LLP

(57) ABSTRACT

There is provided a method of testing a first device using a tester. The method includes receiving test data having a pattern by the first device from the tester; detecting the pattern of the test data by the first device; generating first data, by the first device, according to the pattern detected by the detecting; comparing the test data with the pattern detected by the detecting; determining errors in the test data, by the first device, based on the comparing; inserting the errors into the first data to generate error-inserted first data; and transmitting the error-inserted first data by the first device to the tester. The method may further include generating a first clock at the first device; wherein the transmitting uses the first clock for transmitting the error-inserted first data.

20 Claims, 4 Drawing Sheets

METHOD AND SYSTEM FOR TESTING DEVICES USING LOOP-BACK PSEUDO RANDOM DATA

BACKGROUND OF THE INVENTION

1. Field of the Invention

The present invention relates generally to communication devices. More particularly, the present invention relates to the testing of communication devices.

2. Background Art

Monitoring the quality of service (QoS) of a communication path has typically relied upon sporadic bit-error-rate (BER) testing. Today, communication devices go through BER testing prior to incorporation into communication networks to ensure an acceptable QoS. BER testing plays a vital role in successful development and manufacturing of communication devices. BER testing verifies compatibility with network requirements and can provide priceless diagnostic information during the critical integration testing.

BER testing is commonplace in data communication systems, and in such systems, Pseudo Random Bit Sequence (PRBS) is traditionally transmitted through the device under test (DUT) and looped back, and an error detector at the tester counts any unexpected bit as an error. Such loop-back testing is important in characterizing a DUT by a tester, screening the DUT for IEEE compliance, looking for receiver side BER on the DUT. PRBS is usually generated by applying a polynomial to a binary sequence, e.g. applying a number of XOR (exclusive OR) operations to a binary shift register, and a PRBS generator may be able to generate a PRBS with maximum pattern length of $2^n-1$, where n=7, 9, 11, 15, 20, 23, 31, and having N Mbits of programmable or user-defined pattern. PRBS testing is a standard and accepted method of testing due to the DC balanced and transition density of the sequence. By varying the PRBS polynomial, one can further stress the DUT.

FIG. 1 illustrates conventional testing system 100 utilizing tester device or system 110 for testing DUT 150. The approach of FIG. 1 may typically be referred to as parallel loop-back for looping back the recovered data to the transmitter through the use of FIFOs. As shown in FIG. 1, tester device 110 includes pattern generator 130, which generates a pre-defined pattern or Tx Data 132, such as a PRBS pattern. Tester device 110 also includes a transmitter or TX1 131, which transmits Tx Data 132 over a communication line, such as a wired line, wireless line or optic line, according to a local clock or C1 127, which is generated by a clock generator or (phase locked loop) PLL1 125 based on a crystal frequency or X1 120.

At the other end, the communication line is connected to DUT 150, such that DUT 150 receiver or RX2 174 receives Tx Data 132 based on a recovered C1 127 clock as Rx Data 172, and DUT 150 is configured in loop-back test mode to send Rx Data 172 to DUT 150 transmitter or TX2 171 for transmission to tester device 110, over the communication line, using the recovered C1 127 by DUT 150. Although DUT 150 includes a clock generator or (phase locked loop) PLL2 165 for generation of a local clock or C2 167 based on a crystal frequency or X2 160, C2 167 is not used by conventional testing system 100, because there is a difference in crystal frequencies X1 120 and X2 160.

Continuing with FIG. 1, tester device 110 receiver or RX1 134 receives transmitted Rx Data 172 by TX2 171, which is transmitted by DUT 150 using the recovered C1 127, shown as C1' 173 to indicate a frequency offset between C1 127 and the recovered clock at RX2 174. Next, RX1 134 provides the received data to error detector 140, which compares the received data with Tx Data 132, provided by pattern generator 130, to detect errors and generates BER 145. However, at least one problem with the approach of conventional testing system 100 is that the recovered clock or C1' 173 has a frequency offset with respect to C1 127, and this frequency offset causes additional non-existent bit errors due to at least the finite size of the FIFOs.

Another conventional approach is shown in FIG. 2, which illustrates conventional testing system 200 utilizing tester device 210 for testing DUT 250. The conventional approach of FIG. 2 attempts to cure the problems in the conventional approach of FIG. 1 by using a second PLL or PLL 280 at DUT 250, as explained below. As shown in FIG. 2, tester device 210 includes pattern generator 230, which generates a pre-defined pattern or Tx Data 232, such as a PRBS pattern. Tester device 210 also includes a transmitter or TX1 231, which transmits Tx Data 232 over a communication line, such as a wired line, wireless line or optic line, according to a local clock or C1 227, which is generated by PLL1 225 based on a crystal frequency or X1 220.

At the other end, the communication line is connected to DUT 250, such that DUT 250 receiver or RX2 274 receives Tx Data 232 based on a recovered C1 227 clock as Rx Data 272, and DUT 250 is configured in loop-back test mode to send Rx Data 272 to DUT 250 transmitter or TX2 271 for transmission to tester device 210, over the communication line, using C1 127 that is generated by additional PLL 280 based on the recovered clock or C1' 273. Although DUT includes PLL2 265 for generation of a local clock or C2 267 based on a crystal frequency or X2 260, C2 267 is not used by conventional testing system 200, because there is a difference in crystal frequencies X1 220 and X2 260. However, a clock generator or (phase locked loop) PLL3 280 is added to DUT 250 for the purpose of adjusting C1' 273 using X2 260 to generate C1 227 at DUT 250, and TX2 271 transmits RX Data 272 based on C1 227 generated at DUT 250.

Tester device 210 receiver or RX1 224 receives transmitted Rx Data 272 by TX2 271, which is transmitted by DUT 250 using C1 127 generated at DUT 250. RX1 234 provides the received data to error detector 240, which compares the received data with Tx Data 232 provided by pattern generator 230 to detect errors, and generates BER 245.

Conventional testing system 200 of FIG. 2, however, suffers from a number of drawbacks. For example, PLL3 280 increases the area of the chip in addition to increasing the power consumption, and may also cause a coupling problem with PLL 265.

Accordingly, there is a need in the art to overcome the foregoing shortcomings in the conventional approaches and introduce a reliable and efficient approach to loop-back testing in communication devices.

SUMMARY OF THE INVENTION

There is provided method and system for testing devices using loop-back pseudo random data, substantially as shown in and/or described in connection with at least one of the figures, as set forth more completely in the claims.

BRIEF DESCRIPTION OF THE DRAWINGS

The features and advantages of the present invention will become more readily apparent to those ordinarily skilled in the art after reviewing the following detailed description and accompanying drawings, wherein.

DETAILED DESCRIPTION OF THE INVENTION

Figure 1:
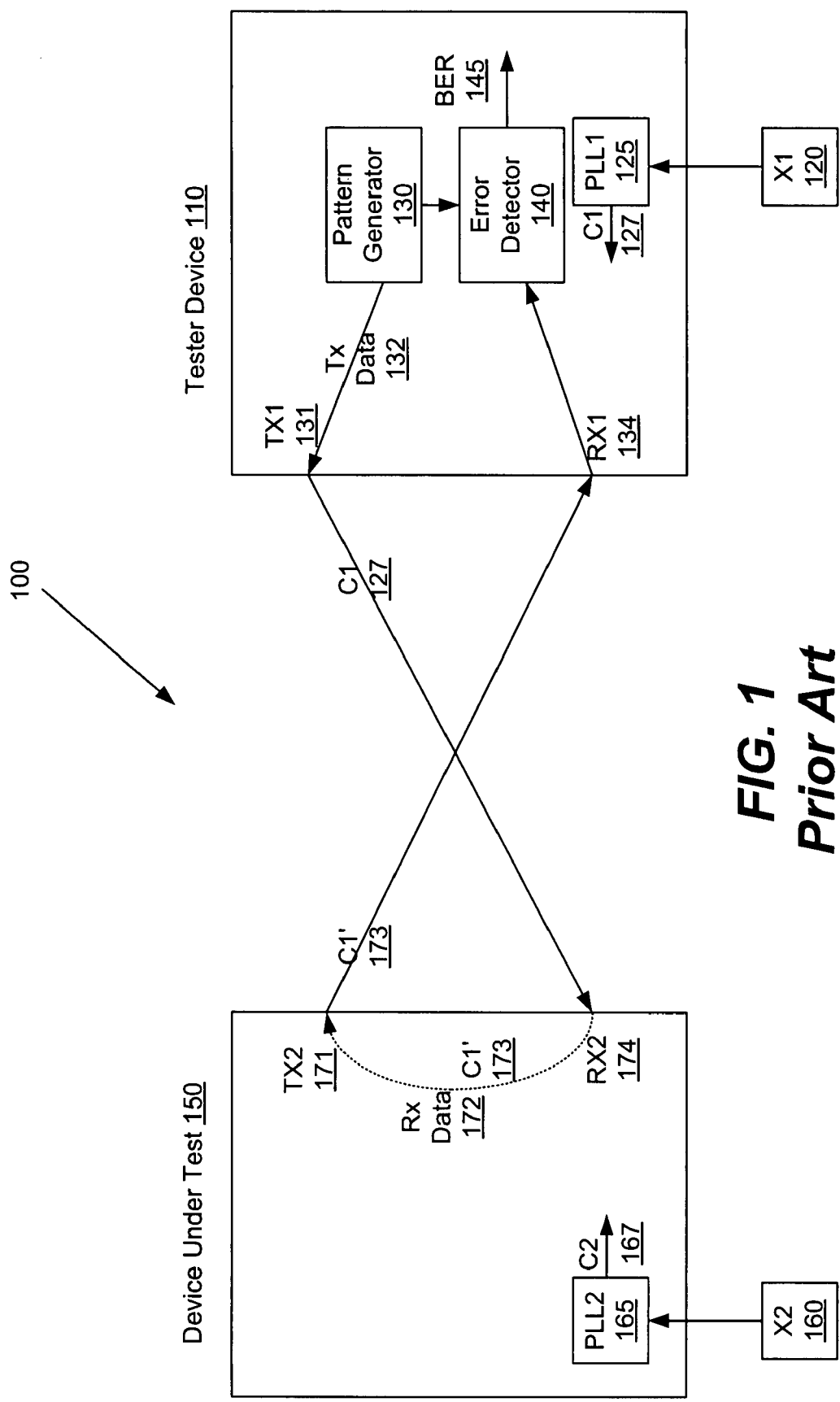
FIG. 1 illustrates a conventional testing system utilizing a tester device for testing a DUT.
Figure 2:
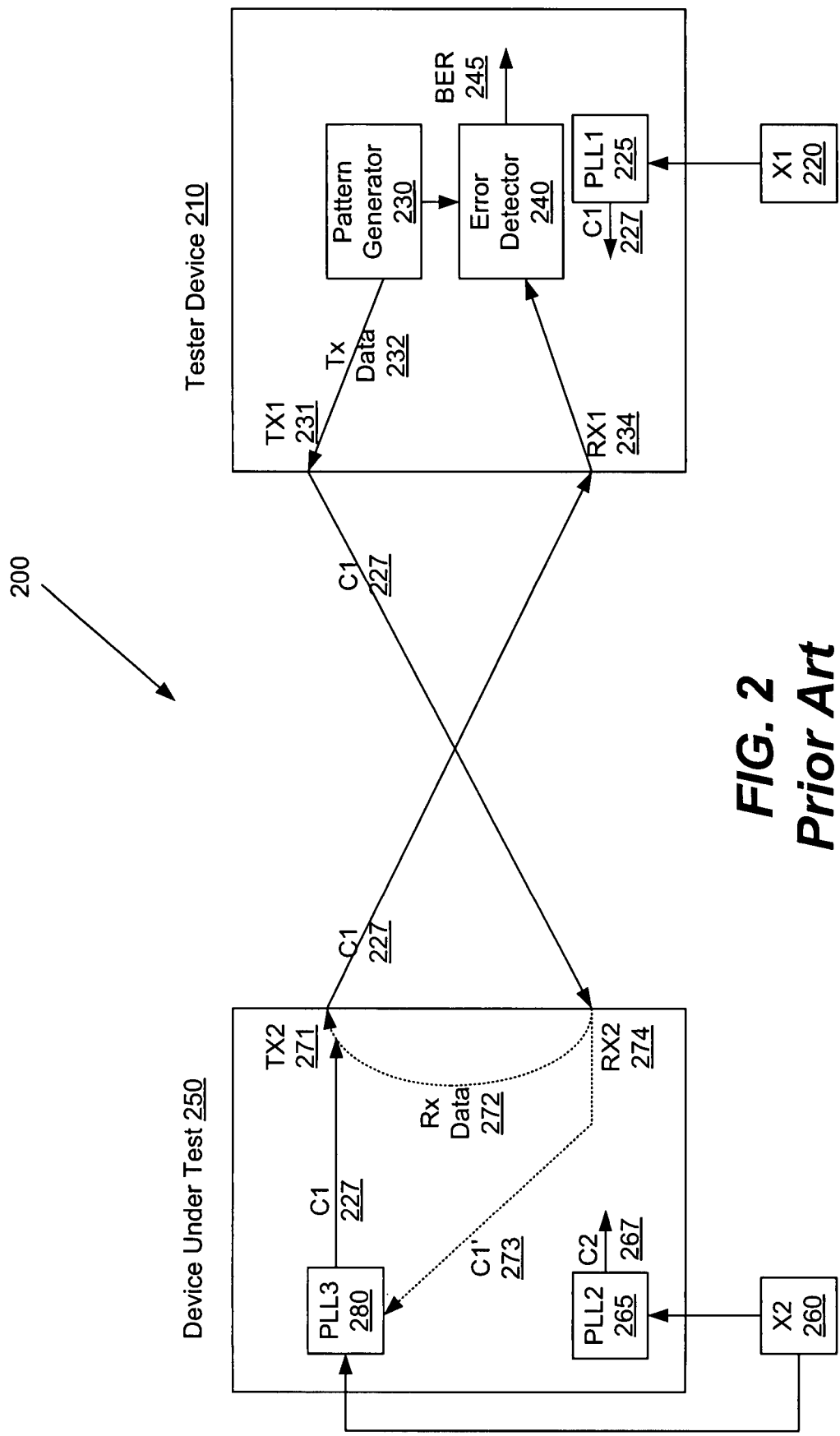
FIG. 2 illustrates another conventional testing system utilizing a tester device for testing a DUT.

Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art. The drawings in the present application and their accompanying detailed description are directed to merely example embodiments of the invention. To maintain brevity, other embodiments of the invention which use the principles of the present invention are not specifically described in the present application and are not specifically illustrated by the present drawings. It should be borne in mind that, unless noted otherwise, like or corresponding elements among the figures may be indicated by like or corresponding reference numerals.

Figure 3:
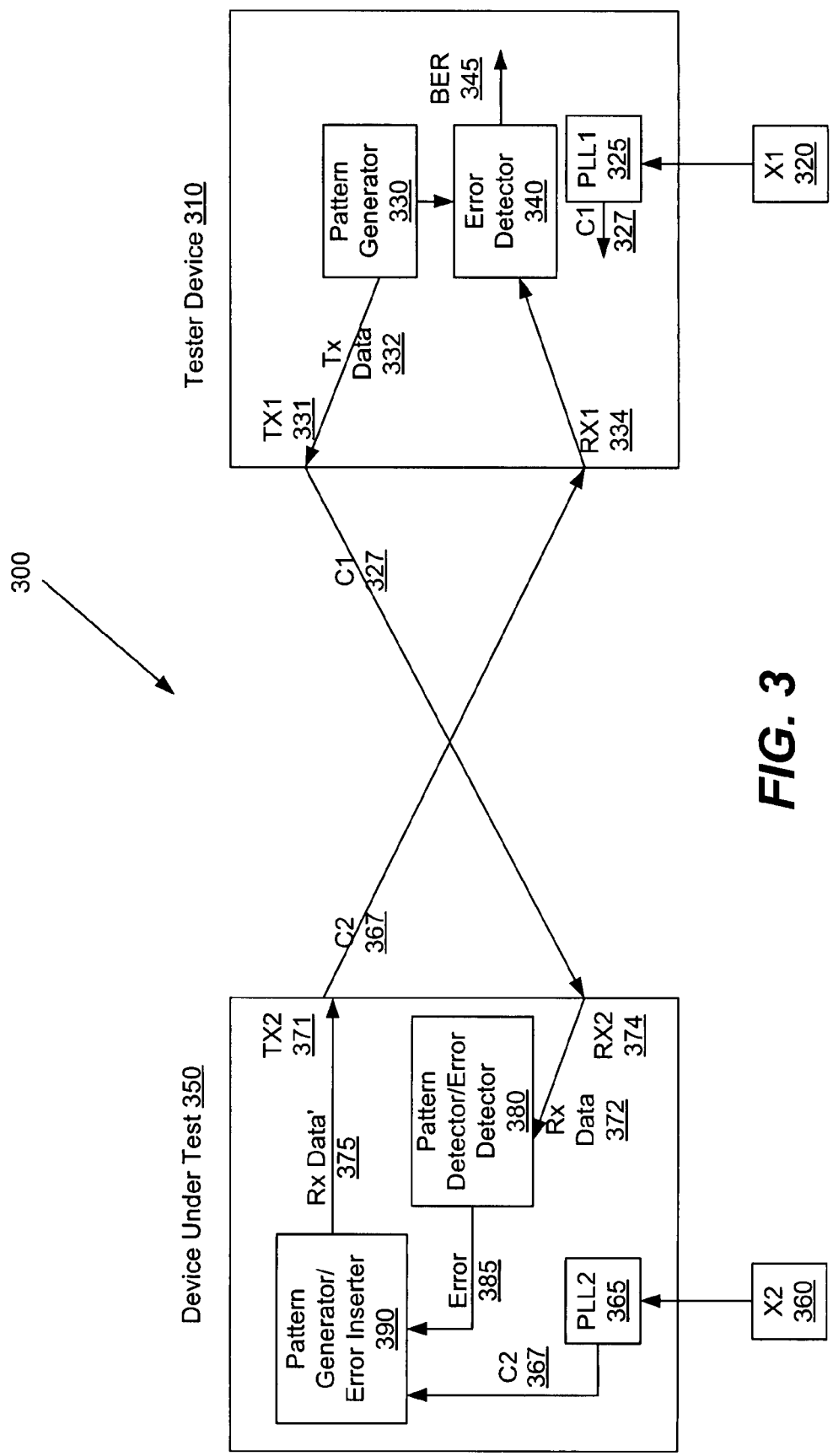
FIG. 3 illustrates a testing system utilizing a tester device for testing a DUT, according to one embodiment of the present invention.

FIG. 3 illustrates testing system 300 utilizing tester device or system 310 for testing DUT 350, according to one embodiment of the present invention. As shown in FIG. 3, tester device 310 includes pattern generator 330, which generates a pre-defined pattern or Tx Data 332, such as a PRBS pattern. Tester device 310 also includes a transmitter or TX1 331, which transmits Tx Data 332 over a communication line, such as a wired line, wireless line or optic line, according to a local clock or C1 327, which is generated by a clock generator or (phase locked loop) PLL1 325 based on a crystal frequency or X1 320.

At the other end, the communication line is connected to DUT 350, such that DUT 350 receiver or RX2 374 receives Tx Data 332 based on a recovered C1 327 clock as Rx Data 372, and DUT 350 is configured in loop-back test mode, so that tester device 310 can determine the number of bit errors in Rx Data 372. According to the present embodiment, DUT 350 includes pattern detector/error detector (PDED) 372, which receives Rx Data 372 and determines the pre-defined pattern of Rx Data 372. For example, in cases where Rx Data 372 is PRBS data, according to known conventional schemes, PDED 372 can determine the order of the PRBS data, and thus detect the pre-defined pattern.

DUT 350 also includes pattern generator/error inserter (PGEI) 390, which is configured according to the pre-defined pattern detected by PDED 372 to generate the detected pre-defined pattern using a local clock or C2 367 generated by a clock generator or (phase locked loop) PLL2 365 based on a crystal frequency or X2 360. In addition, PDED 372 monitors Rx Data 372 and detects bit errors in Rx Data 372 by comparing Rx Data 372 with the detected pre-defined pattern. PDED 372 communicates bit errors 385 to PGEI 390, and PGEI 390 causes the bit errors to be inserted or appear in the detected pre-defined pattern being generated by PGEI 390, which generated bit pattern is designated by Rx Data' 375. DUT 350 also includes a transmitter or TX 371, which transmits Rx Data' 375, over the communication line, to RX1 334 of tester device 310. In one embodiment, PDED 372 may also provide the locations of bit errors to PGEI 390, and PGEI 390 may insert the bit errors in the same or substantially the same locations of the generated bit pattern at DUT 350. It should be noted that although pattern detector and error detector in DUT 350 are shown as one element, it is merely for convenience and they may be separate elements. Similarly, pattern generator and error inserter are also shown as one element for mere convenience, but they may be separate elements.

Turning back to FIG. 3, RX1 324 receives Rx Data' 372 by TX2 371 according to C2 327 generated at DUT 350. RX1 334 provides the received data to error detector 340, which compares the received data with Tx Data 332 provided by pattern generator 330 to detect errors, and generates BER 345. Therefore, according to the embodiment of FIG. 3, BER 345 is indicative of the actual bit errors experienced at DUT 350; however, the embodiment of FIG. 3 avoids the drawbacks of the conventional approaches. It should be noted that in another embodiment of the present invention, PGEI 390 may use the recovered receive clock at RX2 374, rather than using C2 367, for generation and transmission of Rx Data' 375.

Figure 4:
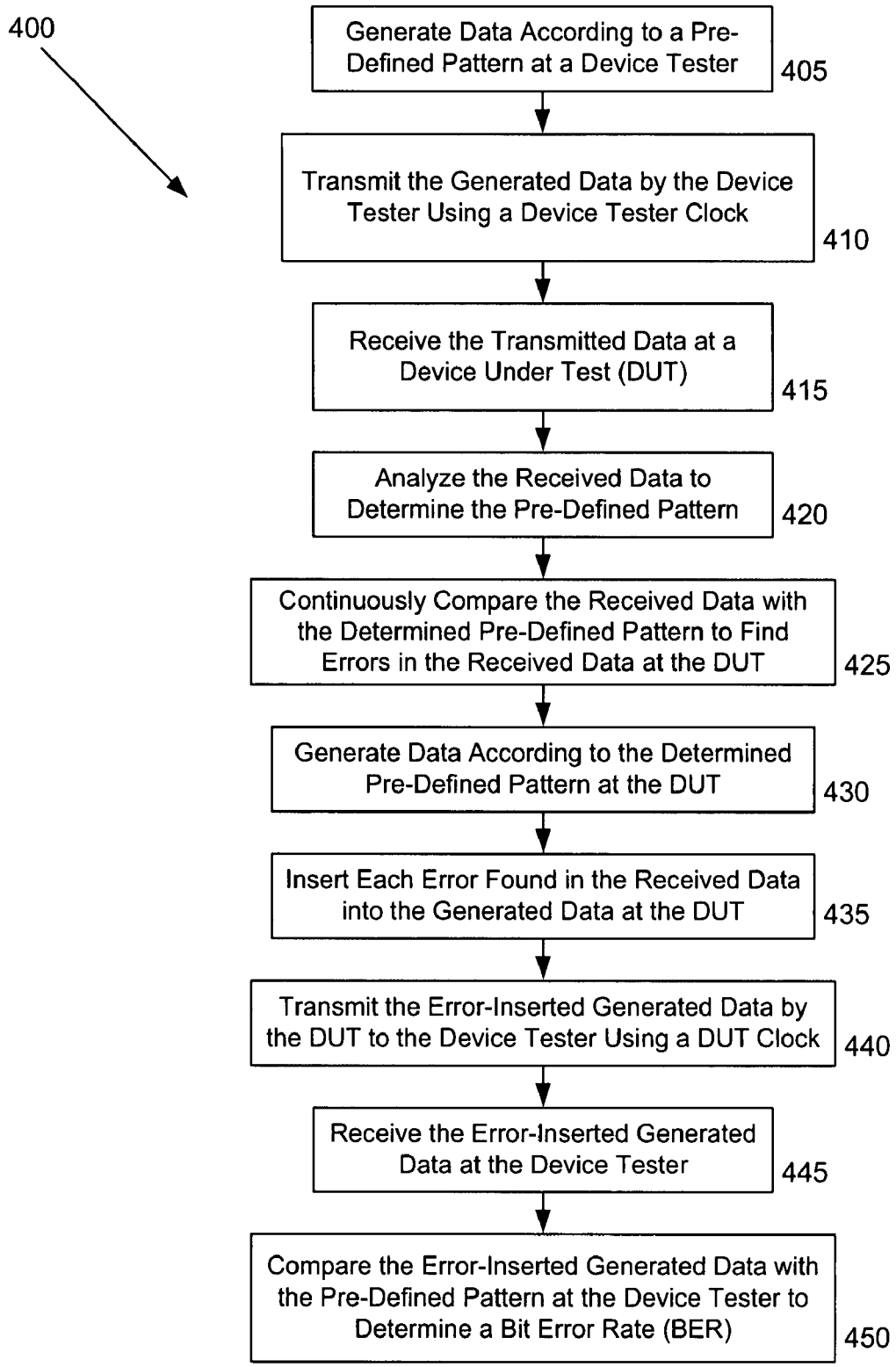
FIG. 4 illustrates a process flow diagram for testing a DUT using a tester device in a testing system, such as the testing system of FIG. 3.

FIG. 4 illustrates process flow diagram 400 for testing a DUT by a tester device or system in a testing system, such as testing system 300 of FIG. 3. As shown, process 400 starts at step 405, where pattern generator 330 generates test data according to a pre-defined pattern, such as a PRBS pattern. Next, at step 410, TX1 331 transmits the generated pre-defined pattern or Tx Data 332 to DUT 350 using the local clock or C1 327. At step 415, RX2 374 receives Tx Data 332 as Rx Data 372. At step 420, PDED 380 analyzes Rx Data 372 to determine its pattern, such as the order of PRBS data generated by pattern generator 330.

Next, at step 425, PDED 380 continuously monitors Rx Data 372 and compares Rx Data 372 against the detected pattern at step 420 to find and/or locate the bit errors in Rx Data 372. Further, at step 430, PGEI 390 generates data according to the detected pattern at step 420, and at step 435, PGEI 390 inserts the bit errors found in step 425 into the data being generated at step 430 to generate Rx Data' 375. At step 440, DUT 350 transmits the error-inserted data of step 430 or Rx Data' 375 to tester device 310 using a local clock at DUT 350 or C2 367. As mentioned above, in one embodiment, DUT 350 may generate and transmit the error-inserted data of step 430 or Rx Data' 375 to tester device 310 using the recovered clock at RX2 374.

At tester device 310, in step 445, RX1 334 receives Rx Data's 375, and at step 450, error detector 340 compares Rx Data' 375 with the pre-defined data pattern or Tx Data 332 to detect errors, and generates BER 345.

From the above description of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

What is claimed is:

1. A method of testing a first device using a tester, the method comprising:

receiving test data having a pattern by the first device from the tester;

detecting the pattern of the test data by the first device;

generating first data, by the first device, according to the pattern detected by the detecting;

comparing the test data with the pattern detected by the detecting;

determining errors in the test data, by the first device, based on the comparing;

inserting the errors into the first data to generate error-inserted first data; and transmitting the error-inserted first data by the first device to the tester.

2. The method of claim 1 further comprising:

generating a first clock at the first device;

wherein the transmitting uses the first clock for transmitting the error-inserted first data.

3. The method of claim 1 further comprising:

recovering a receive clock for the test data at the first device;

wherein the transmitting uses the receive clock for transmitting the error-inserted first data.

4. The method of claim 1, wherein the test data is Pseudo Random Bit Sequence (PRBS) data.

5. The method of claim 4, wherein the detecting detects an order of PRBS data.

6. The method of claim 1, wherein the receiving receives the test data at a receive clock generated by a first crystal and the transmitting transmits the error-inserted first data at a first clock generated by the first device using a second crystal.

7. The method of claim 1, wherein the inserting inserts the errors into the first data at substantially the same locations as the determining determines errors in the test data.

8. A first device operable for testing by a tester, the first device comprising:

a receiver operable to receive test data having a pattern from the tester;

a pattern detector operable to detect the pattern of the test data;

a pattern generator operable to generate first data according to the pattern detected by the pattern detector;

an error detector operable to compare the test data with the pattern detected by the pattern detector and determine errors in the test data based on comparing;

an error inserter operable to insert the errors into the first data to generate error-inserted first data; and a transmitter operable to transmit the error-inserted first data by the first device to the tester.

9. The first device of claim 8 further comprising:

a clock generator operable to generate a first clock;

wherein the transmitter is operable to transmit the error-inserted first data using the first clock.

10. The first device of claim 8, wherein the receiver is further operable to recover a receive clock for the test data, and wherein the transmitter is operable to transmit the error-inserted first data using the receive clock.

11. The first device of claim 8, wherein the a pattern generator is a Pseudo Random Bit Sequence (PRBS) data generator.

12. The first device of claim 11, wherein the pattern detector is operable to detect an order of PRBS data.

13. The first device of claim 8, wherein the receiver is operable to receive the test data at a receive clock generated by a first crystal and the transmitter is operable to transmit the error-inserted first data at a first clock generated by the clock generator using a second crystal.

14. The first device of claim 8, wherein the error inserter is operable to insert the errors into the first data at substantially the same locations as the error detector finds errors in the test data.

15. A testing system comprising:

a first device including:

a first receiver operable to receive test data having a pattern;

a pattern detector operable to detect the pattern of the test data;

a first pattern generator operable to generate first data according to the pattern detected by the pattern detector;

a first error detector operable to compare the test data with the pattern detected by the pattern detector and determine errors in the test data based on comparing;

an error inserter operable to insert the errors into the first data to generate error-inserted first data; and a first transmitter operable to transmit the error-inserted first data by the first device;

a second device including:

a second pattern generator operable to generate the test data;

a second transmitter operable to transmit the test data to the first device;

a second receiver operable to receive the error-inserted first data from the first device;

a second error detector operable to compare the error-inserted first data with the test data and determine errors in the test data based on comparing.

16. The testing system of claim 15, wherein:

the first device further comprises a first clock generator operable to generate a first clock, wherein the first transmitter is operable to transmit the error-inserted first data using the first clock; and the second device further comprises a second clock generator operable to generate a second clock, wherein the second transmitter is operable to transmit the test data using the second clock.

17. The testing system of claim 16, wherein the first clock uses a first crystal to generate the first clock, and the second clock uses a second crystal to generate the second clock.

18. The testing system of claim 15, wherein:

the first device further comprises a first clock generator operable to generate a first clock;

the second device further comprises a second clock generator operable to generate a second clock, wherein the second transmitter is operable to transmit the test data using the second clock;

wherein the first receiver is further operable to recover the second clock, and wherein the first transmitter is operable to transmit the error-inserted first data using the receive clock.

19. The testing system of claim 15, wherein each of the first pattern generator and the second pattern generator is a Pseudo Random Bit Sequence (PRBS) data generator.

20. The testing system of claim 15, wherein the error inserter is operable to insert the errors into the first data at substantially the same locations as the first error detector finds errors in the test data.

* * * * *